United States Patent [19]
Katampe et al.

[11] Patent Number: 6,037,094
[45] Date of Patent: Mar. 14, 2000

[54] PHOTOSENSITIVE MATERIAL EMPLOYING MICROCAPSULES AND SUPERABSORBENT POLYMER

[75] Inventors: Ibrahim Katampe, Dayton; Joseph C. Camillus, Centerville, both of Ohio

[73] Assignee: Cycolor, Inc., Miamisburg, Ohio

[21] Appl. No.: 09/177,775

[22] Filed: Oct. 23, 1998

[51] Int. Cl.⁷ .............................. G03C 1/40; G03C 1/00
[52] U.S. Cl. ............................................. 430/138; 430/211
[58] Field of Search .................................. 430/138, 211, 430/235, 271.1, 962

[56] References Cited

U.S. PATENT DOCUMENTS

| | | | |
|---|---|---|---|
| 2,730,456 | 1/1956 | Green et al. | 117/36 |
| 2,800,457 | 7/1957 | Green et al. | 252/316 |
| 3,652,276 | 3/1972 | Bartlett et al. | 430/413 |
| 3,672,935 | 6/1972 | Miller et al. | 117/36.8 |
| 3,732,120 | 5/1973 | Brockett et al. | 117/16 |
| 3,755,190 | 8/1973 | Hart et al. | 252/316 |
| 3,796,669 | 3/1974 | Kiritani et al. | 252/316 |
| 3,914,511 | 10/1975 | Vassiliades | 428/411 |
| 3,920,510 | 11/1975 | Hatano et al. | 161/162 |
| 4,001,140 | 1/1977 | Foris et al. | 252/316 |
| 4,025,455 | 5/1977 | Shackle | 252/316 |
| 4,087,376 | 5/1978 | Foris et al. | 252/316 |
| 4,089,802 | 5/1978 | Foris et al. | 252/316 |
| 4,399,209 | 8/1983 | Sanders et al. | 430/138 |
| 4,416,966 | 11/1983 | Sanders et al. | 430/138 |
| 4,440,846 | 4/1984 | Sanders et al. | 430/138 |
| 4,766,050 | 8/1988 | Jerry | 430/138 |
| 4,772,530 | 9/1988 | Gottschalk et al. | 430/138 |
| 4,772,541 | 9/1988 | Gottschalk et al. | 430/339 |
| 4,800,149 | 1/1989 | Gottschalk et al. | 430/138 |
| 4,842,980 | 6/1989 | Gottschalk et al. | 430/138 |
| 4,865,942 | 9/1989 | Gottschalk et al. | 430/138 |
| 4,965,165 | 10/1990 | Saccocio et al. | 430/138 |
| 5,057,393 | 10/1991 | Shanklin et al. | 430/138 |
| 5,100,755 | 3/1992 | Shanklin | 430/138 |
| 5,112,752 | 5/1992 | Johnson et al. | 435/192 |
| 5,230,982 | 7/1993 | Davis et al. | 430/138 |
| 5,283,152 | 2/1994 | Feldman et al. | 430/138 |

*Primary Examiner*—Janet Baxter
*Assistant Examiner*—Sin J. Lee
*Attorney, Agent, or Firm*—Thompson Hine & Flory LLP

[57] ABSTRACT

A photosensitive material including a support having a layer of photosensitive microcapsules on the surface thereof, the photosensitive microcapsules including an internal phase containing a photosensitive composition and a color precursor wherein, upon image-wise exposing the photosensitive material and rupturing the microcapsules, the color precursor is image-wise released from the microcapsules to form a color image, the photosensitive material further including a superabsorbent polymer or hydrogel, is disclosed.

11 Claims, No Drawings

PHOTOSENSITIVE MATERIAL EMPLOYING MICROCAPSULES AND SUPERABSORBENT POLYMER

BACKGROUND OF THE INVENTION

The present invention relates to an improvement in photosensitive imaging systems of the type described in U.S. Pat. Nos. 4,399,209 and 4,440,846, wherein a superabsorbent polymer (SAP) or hydrogel is incorporated in the photosensitive material and more particularly in the microcapsules themselves. It is believed that the superabsorbent polymer or hydrogel prevents the microcapsules from drying out upon storage.

Photohardenable imaging systems employing microencapsulated radiation sensitive compositions are the subject of commonly assigned U.S. Pat. Nos. 4,399,209; 4,416,966; 4,440,846 and 4,766,050. These imaging systems are characterized in that an imaging sheet including a layer of microcapsules containing a photohardenable composition in the internal phase is image-wise exposed to actinic radiation. In the most typical embodiments, the photohardenable composition is a photopolymerizable composition including a polyethylenically unsaturated compound and a photoinitiator and is encapsulated with a color former. Exposure to actinic radiation hardens the internal phase of the microcapsules. Following exposure, the imaging sheet is subjected to a uniform rupturing force by passing the sheet through the nip between a pair of pressure rollers. An image transfer system in which the developer material is coated on a separate substrate as a separate developer or copy sheet is disclosed in commonly assigned U.S. Pat. No. 4,399,209. A self-contained imaging sheet in which the encapsulated color former and the developer material are co-deposited on one surface of a single substrate as one layer or as two interactive layers is disclosed in commonly assigned U.S. Pat. No. 4,440,846. An imaging system comprising a support, a layer containing microcapsules, a layer of developer material, and a layer containing an opacifying agent is disclosed in commonly assigned U.S. Pat. No. 4,766,050. The opacifying agent can form a separate layer or can be part of the layer containing the microcapsules or both but is interposed between the microcapsules and the developer to hide the microcapsules when viewing the image.

When imaging systems, particularly the self-contained imaging systems of the type described in U.S. Pat. No. 4,440,846 and recently allowed copending U.S. application Ser. No. 08/570,658 filed Dec. 11, 1995 are exposed and developed after having been stored for a period of time, the images have a tendency to darken over time. This darkening has been attributed to the presence of undeveloped color precursor outside the capsule which gradually reacts with the developer material and causes the image to darken.

Accordingly, it is desirable to provide an imaging system wherein this undesirable tendency to darken over time is reduced or eliminated.

SUMMARY OF THE INVENTION

Experimental studies have shown that if imaging media employing photosensitive microcapsules is stored under relatively high humidity, the amount of undeveloped color precursor that is observed outside the capsules after exposure and development is significantly less than is observed when the media is stored under relatively dry conditions and the tendency for the image to darken is reduced or eliminated. This observation led to the hypothesis that upon storage under relatively dry conditions, the capsules are releasing more of their contents when they are ruptured and that the capsules themselves may be drying out and becoming more brittle and more readily rupturable upon storage. It is believed that a dry capsule is brittle and able to release more color precursor when it ruptures, whereas a softer, less dry capsule, tends to retain more color precursor after it ruptures making less undeveloped color precursor available to darken the image.

In accordance with the invention, a superabsorbent polymer (SAP) or hydrogel is incorporated in the microcapsule imaging system to prevent or reduce the tendency of the image to darken. While not desiring to be bound, it is believed that the superabsorbent polymer or hydrogel prevents the microcapsule from drying out upon storage. The superabsorbent polymer can be incorporated anywhere in the photosensitive material, i.e., it can be present in the microcapsules, in the layer containing the microcapsules, in a sublayer, or in the developer layer. However, it is preferred to incorporate the superabsorbent polymer in the microcapsules or in the microcapsule layer. For example, the superabsorbent polymer can be incorporated in the internal phase of the microcapsules, in the walls of the microcapsules or in the binder that adheres the layer of microcapsules to the support used in the imaging material.

It has been found that when a superabsorbent polymer is incorporated in an imaging material in the manner described herein, improvements in $D_{min}$, color brightness, image stability and shelf life may be observed.

DETAILED DESCRIPTION OF THE INVENTION

U.S. Pat. Nos. 4,399,209 and 4,440,846 and pending application Ser. No. 08/570,658 filed Dec. 11, 1995 describe materials, methods and film constructions that are useful in practicing the invention disclosed herein and are incorporated herein by reference.

The improved imaging system of the invention may be embodied in a self-contained copy sheet in which the encapsulated chromogenic material and the developer material are co-deposited on one surface of a single substrate as one layer or as two interactive layers or they are deposited on two supports in layers which can interact when the supports are juxtaposed; or it may be embodied in a transfer system in which the developer material is coated on a separate substrate as a separate developer or copy sheet. Both systems operate by photographic control of the access between the chromogenic material and the developer as previously described. In the transfer and self-contained imaging system, following image-wise exposure of the photosensitive material, the material is subjected to pressure to rupture the capsules. The chromogenic material and the developer are able to react to form a visible image in the exposed or the unexposed areas (depending on whether the imaging system is a positive or negative working system the photosensitive composition is photohardened or photosoftened). Gradual development of the visible image is observed following exposure and capsule rupture as the chromogenic material and developer migrate, mix and react on the sheet.

Typically, capsule rupture is effected by the application of pressure to the imaging sheet alone (in the case of a self-contained system) or in contact with a developer sheet (in a transfer system). Various means for applying pressure may be used including pressure rollers, a roller ball or a pressure wheel, all of which are known in the art.

In accordance with one embodiment of the invention a superabsorbent polymer is incorporated into the internal phase of the microcapsules. A superabsorbent polymer is a polymer which is capable of absorbing water and forming a gel. In this embodiment, the superabsorbent polymer is dissolved or displaced in the internal phase constituents prior to encapsulation. The amount of superabsorbent polymer added will vary with the nature of the polymer and the internal phase, e.g., the monomer, the solubility of the polymer in the internal phase, and the ability of the polymer to absorb water. The superabsorbent polymer can be added to the internal phase in an amount of about 0.05 to 2.5% based on the monomer and more typically 0.05 to 1.5%. Polyacrylic acid superabsorbent polymers are particularly desirable for use in this embodiment of the invention because they are compatible with the acrylate monomers preferably used in the internal phase.

In another embodiment of the invention, the superabsorbent polymer is added to the microcapsule coating composition. The superabsorbent polymer can be dissolved or dispersed in the continuous phase during encapsulation such that it becomes part of the coating composition when the microcapsules are collected and blended with binders such as polyvinyl alcohol to form the coating composition. Alternatively, the superabsorbent polymer is added to the microcapsule coating composition after the microcapsules are recovered in the encapsulation process. Also, when the superabsorbent polymer is added to the internal phase, some of the superabsorbent polymer may move into the continuous phase and become part of the microcapsule coating composition. The amount of superabsorbent polymer added to the coating composition will vary with the nature of the superabsorbent polymer and the nature and amount of the other resins used in the composition. The amount should be limited to an amount that does not interfere with capsule rupture and reaction of the color former with the developer such that $D_{max}$ is reduced. The superabsorbent polymer is preferably incorporated in the coating composition in an amount of about 1 to 10% based on resin solids used in the composition and more typically in an amount of 1 to 5%.

In a further embodiment, the superabsorbent polymer can be added to the developer material and coated in a self-contained format in a layer that is preferably but not necessarily coated adjacent to or juxtaposed with the microcapsule layer. In this case, the superabsorbent polymer can be added to the developer coating composition in the amounts described above for the microcapsule coating composition.

It may also be feasible to add the superabsorbent polymer alone or in combination with other materials to auxiliary layers or a subbing layer that is coated upon or adjacent to the microcapsule layer.

Representative examples of superabsorbent polymers useful in the present invention are known in the art and include vinyl alcohol polymers or copolymers; acrylic or methacrylic acid polymers or copolymers; sodium or potassium salts of acrylic or methacrylic acid polymers or copolymers; and alkyl, hydroxyalkyl, or hydroxyalkyl ether esters of acrylic or methacrylic acid polymers or copolymers. Examples of commercially available superabsorbent polymers that may be used are: Sigma-Aldrich Cat. No. 41602-9 (Polyacrylic acid sodium salt); Sigma-Aldrich Cat. No. 43532-5 (Polyacrylic acid potassium salt); Nippon Shokubai K.K., AQUALIC AS-58 (polyacrylic acid); Nippon Shokubai K.K., AQUALIC CA (type ML-10) (crosslinked acrylic acid-sodium acrylate copolymer); Nihon Jonyaku Co., Ltd., JURYMER AC-10L (polyacrylic acid); Nihon Junyaku Co., Ltd., JURYMER AC-105 (polyacrylic acid); Arakowa Chemical Industries, Ltd., ARASORB-F; and Sumitomo Seika Chemicals Co., Ltd., AQUAKEEP-10SH-NF.

The operational center of the imaging system of the present invention is the encapsulate or internal phase of the coating composition and optionally a chromogenic material. In accordance with the invention, the internal phase comprises a photosensitive composition. Typically, the photosensitive composition includes a photoinitiator and a substance which undergoes a change in viscosity upon exposure to light in the presence of the photoinitiator. That substance may be a monomer, dimer, or oligomer which is polymerized to a higher molecular weight compound or it may be a polymer which is cross-linked. Alternatively it may be a compound which is depolymerized or otherwise decomposed upon exposure.

Typically, the substance which undergoes a change in viscosity is a free radical addition polymerizable or crosslinkable compound. The most typical examples of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol 1,6-dimethacrylate, and diethylene glycol dimethacrylate.

Another radiation curable substance is an acrylate prepolymer derived from the partial reaction of pentaerythritol with acrylic acid or acrylic acid esters. Radiation curable compositions based on such prepolymers having an acrylate functionality of between approximately two and three are available commercially in two-package system radiation curable compositions from the Richardson Company, Melrose Park, Ill., such as RL-1482 and RL-1483 which are recommended to be mixed together to form a radiation curable clear varnish in a ratio of 4.4 parts of RL-1482 to 1 part RL-1483. Another class of curable materials useful in the present invention are found in radiation curable inks as the photosensitive component such as a mixture of a pentaerythritol acrylate and halogenated aromatic, alicyclic or aliphatic photoinitiator as disclosed in U.S. Pat. No. 3,661,614 to Bessemir et al, which is also incorporated by reference. Another type radiation curable material is halogenated resins which can be crosslinked up exposure, to ultraviolet radiation.

Some typical examples of radiation de-polymerizable materials useful in other embodiments of the invention are 3-oximino-2-butanone methacrylate which undergoes main chain scission upon ultraviolet exposure and poly (4'-alkyl acylo-phenones. See Reichmanis, E.; *Am. Chem. Soc. Div. Org. Coat. Plast. Chem. Prepr.* 1980, 43, 243–251 and Lukac, I.; Chmela S., Int. Conf. on Modif. Polym. 5th Bratislava, Czech, July 3–6, I.U.P.A.C. Oxford, England, 1979, 1, 176–182.

The radiation curable or depolymerizable material usually makes up the majority of the internal phase. A radiation curable material must be present in an amount sufficient to immobilize the chromogenic material upon exposure. With a depolymerizable material, on the other hand, the internal phase must be constituted such that the chromogenic material is immobilized prior to exposure but is released after exposure and capsule rupture. Typically these materials constitute 40 to 99 wt % of the internal phase (based on the weight of the oil solution containing the chromogen, the photosensitive composition and the carrier oil when present). In some embodiments, it has been found desirable to dilute the photosensitive composition with a carrier oil to improve half-tone gradation. In these cases a carrier oil is present in the amounts disclosed below and the aforesaid materials make up to 40 wt % of the internal phase.

The chromogenic materials used in the present invention are those chromogenic materials conventionally used in carbonless paper. In general, these materials are colorless electron donating type dry precursor compounds which react with a developer compound to generate a dye. Representative examples of such color formers include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl) phthalide, 3-(p-dimethylaminophenyl)-3-(1,2 dimethylindole-3-yl)phthalide, 3-(p-dimethylaminophenyl)-3-(2-methylindole-3-yl)phthalide, 3-(p-dimethylaminophenyl)- 3-(2-phenylindole-3-yl)phthalide, 3,3-bis(1,2-dimethylindole-3-yl)-5-dimethylaminophthalide, 3,3-bis-(1,2-dimethylindole-3-yl) 6-dimethylaminophthalide, 3,3-bis-(9-ethylcarbazole-3-yl)-5-dimethylaminophthalide, 3,3-bix(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Thodamine-(p-nitroanilino) lactam, Rhodamine-B-(p-chloroanilino)lactam, 3-dimethylamino-6-methoxyfluoran, 3-diethylamino-7-methoxyfluoran, 3-diethylamino-7-chloro-6-methylfluoroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethylmethylamino)fluoran, 3-diethylamino-7-(diethylamino)fluoran, 3-methyl-spiro-dinaphthopyran, 3,3'-dichloro-spiro-dinaphthopyran, 3-benzyl-spiro-dinaphthopyran, 3-methyl-naphtho-(3-methoxybenzo)-spiropyran, 3-propyl-spirodibenzoidipyran, etc. Mixtures of these color precursors can be used if desired. Also useful in the present invention are the fluoran color formers disclosed in U.S. Pat. No. 3,920,510, which is incorporated by reference. In addition to the foregoing dye precursors, fluoran compounds such as disclosed in U.S. Pat. No. 3,920,510 can be used. In addition, organic compounds capable of reacting with heavy metal salts to give colored metal complexes, chelates or salts can be adapted for use in the present invention.

In accordance with the invention, the chromogenic material is incorporated in the internal phase in an amount sufficient to produce a visible image of the desired density upon reaction with the developer. In general, these amounts range from approximately 0.5 to about 20.0 percent based on the weight of the internal phase solution (e.g., monomer or monomer and oil) containing the chromogen. A preferred range is from about 2 percent to about 7 percent. The amount of the chromogenic material required to obtain suitable images depends on the nature of the chromogen, the nature of the internal phase, and the type of imaging system. Typically less chromogenic material is used in the internal phase of a self-contained imaging system in comparison to a transfer system. This is because the developer material is co-deposited on a common substrate with the chromogenic encapsulate and there is a tendency for the chromogenic material to diffuse through the capsule wall and react with the developer material during storage and because there is no inherent loss in transfer. One means of preventing undesired coloration in a self-contained sheet is to reduce the amount of the chromogenic material in the internal phase. Another means is to incorporate color suppressants with the chromogenic material.

In addition to the chromogenic material and the photosensitive material, the internal phase of the present invention may also include a carrier oil to affect and control the tonal quality of the images obtained. While tonal quality (half-tone gradation) is not critical when copying printed documents, it is an important factor in faithfully reproducing pictorial images. Initial studies show that where trimethylol propane triacrylate is used in the radiation curable material, 20% of a carrier oil such as brominated paraffin improves tonal qualities. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the chromogenic material in the photosensitive composition before exposure, the nature of the chromogenic material and the viscosity of the characteristics of the internal phase. When present, examples of carrier oils are alkylated biphenyls (e.g., monoisopropylbiphenyl), polychlorinated biphenyls, caster oil, mineral oil, deodorized kerosense, naphthenic mineral oils, dibutyl phthalate, dibutyl fumerate, brominated paraffin and mixtures thereof. Alkylated biphenyls are generally less toxic and preferred.

Various photoinitiators can be selected for use in the present invention. These compounds absorb the exposure radiation and generate a free radical alone or in conjunction with a sensitizer. Conventionally, there are homolytic photoinitiators which cleave to form two radicals and initiators which radiation converts to an active species which generates a radical by abstracting a hydrogen from a hydrogen donor. There are also initiators which complex with a sensitizer to produce a free radical generating species and initiators which otherwise generate radicals in the presence of a sensitizer. Both types can be used in the present invention. If the system relies upon ionic polymerization to tie up the chromogen, the initiator may be the anion or cation generating type depending on the nature of the polymerization. Where, for example, ultraviolet sensitivity is desired, as in the case of direct transmission imaging using ultraviolet light, suitable photoinitiators include α-alkoxy phenyl ketones, O-acylated-α-oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones; photoreducible dye-reducing agent redox couples, halogenated paraffins (e.g., brominated or chlorinated paraffin) and benzoin alkyl ethers. Specific photoinitiators useful in the present invention include: α-alkoxyketone, α,α-dialkoxyketone, benzophenone, xanthane, chloroxanthanone, chloromethylxanthanone, chlorosulfoxylxanthanone, thioxanthanone, chloroxanthanone, chloromethylthioxanthanone, chlorosulforyl thioxanthanone, chloromethylnaphthalene, chlorosulfonyl naphthalene, chloromethyl anthracene, chlorosulfonyl anthracene, chloromethyl benzoxazole, chloromethyl benzothiazole, chloromethyl benzimidazole, chlorosulfonyl benzoxazole, chlorosulfonyl benzothiazole, chlorosulfonyl benzimidazole, a chloromethyl quinoline, a chlorosulfonyl quinoline, a chloromethyl benzophenone, a chlorosulfonyl benzophenone, a chloromethyl fluorenone, a chlorosulfony fluorenone, carbon tetrabromide, benzoin methyl ether, benzoin ethyl ether, desyl chloride, desyl amine, methylene blue/ascorbic acid, chlorinated aliphatic hydrocarbons and combinations thereof. The sensitivity among these compounds can be shifted by adding substituents such that the compounds generate radicals when exposed to the desired radiation wavelength.

Particularly useful as photoinitiators in the present invention are cationic dye-borate anion complexes as disclosed in commonly assigned U.S. Pat. Nos. 5,112,752; 5,100,755; 5,057,393; 4,865,942; 4,842,980; 4,800,149; 4,772,530 and 4,772,541 which are incorporated herein by reference. While the cationic dye-borate anion complex can be used alone as the initiator, film speeds tend to be quite low and oxygen inhibition is observed. It has been found that it is preferable to use the complex in combination with an autoxidizer. An autoxidizer is a compound which is capable of consuming oxygen in a free radical chain process. Examples of useful autoxidizers are N,N-dialkylanilines. Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo. Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimethylthioanicidine, 4-amino-N,N-dimethylaniline, 3-hydroxy-N,N-dimethylaniline, N,N,N', N'-tetramethyl-1,4-dianiline, 4-acetamido-N,N-dimethylaniline, 2,6-diisopropyl-N,N-dimethylaniline (DIDMA), 2,6-diethyl-N,N-dimethylaniline, N,N, 2,4,6-pentamethylaniline (PMA) and p-t-butyl-N,N-dimethylaniline. In accordance with another aspect of the invention, the dye borate photoinitiator is used in combination with a disulfide coinitiator. Examples of useful disulfides are described in U.S. Pat. No. 5,230,982 which is incorporated herein by reference.

The photoinitiator is present in the internal phase in an amount sufficient to initiate polymerization or cross-linking within a short exposure time. Using benzoin methyl ether as an example, this photoinitiator is typically present in an amount of up to 10% based on an amount of radiation curable material in the internal phase. Naturally, the amount varies depending on the nature of the other components of the photosensitive composition. The cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5% by weight.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(a-methylbenzyl) salicy oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Pat. No. 3,732,120, zinc carbonate etc. and mixtures thereof. The particle size of the developer material is important to obtain a high quality image. The developer particles should be in the range of about 0.2 to 3 microns and, preferably in the range of about 0.5 to 1.5 microns. A suitable binder such as polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of about 1 to 8% by weight, to prepare a coating composition.

A preferred developer material is one which has excellent compatibility with the microcapsule slurry solution. Many materials, including zinc salicylate and some phenolic resin preparations, have marginal or poor compatibility with the MF microcapsule preparation and result in agglomeration which is believed to be due to an incompatibility in the emulsifiers used in preparing the microcapsules and in the developer. The problem manifests itself in increasing solution viscosities or in instability of the microcapsules wall (or both). The microcapsules may become completely disrupted with a complete breakdown or disintegration of the wall. The problem is believed to be caused by the presence of water soluble acid salts in the developer solution. By modifying the acidic salts to make them water insoluble the developer material becomes compatible with the MF microcapsules. A preferred developer, which has good stability is Schenectady International resin HRJ-4250 solution.

One suitable method for encapsulating the internal phase is to disperse a water-immiscible solution of the internal phase constituents in a water miscible solution of the capsule wall forming material and to induce phase separation. In one embodiment of the invention, the internal phase is encapsulated in a urea-formaldehyde wall-former and, more particularly, a urea-resorcinol-formaldehyde wall former in which resorcinol has been added to the wall former to enhance its oleophilicity. Other hydrophilic wall-forming materials which may also be useful in the present invention include gelatin (see U.S. Pat. No. 2,730,456 and 2,800,457 to Green et al) including gum arabic, polyvinyl alcohol, carboxymethyl cellulose; resorcinol-formaldehyde (see U.S. Pat. No. 3,755,190 to Hart et al), isocyanate (see U.S. Pat. No. 3,914,511 to Vassiliades), polyurethane (see U.S. Pat. No. 3,796,669 to Kiritani et al), melamine-formaldehyde resin and hydroxypropyl cellulose, ureaformaldehyde wall-formers and more particularly Urea-resorcinol-formaldehyde wall forms (in which oleophilicity is enhanced by the addition of resorcinal) (see U.S. Pat. Nos. 4,001,140; 4,087,376 and 4,089,802 to Foris et al) melamine-formaldehyde resin and hydroxypropyl cellulose (see commonly assigned U.S. Pat. No. 4,025,455 to Shackle). To the extent necessary for complete disclosure of those wall-forming materials, the above mentioned patents are specifically incorporated by reference. Microencapsulation has been accomplished by a variety of known techniques including coacervation, interfacial polymerization, polymerization of one or more monomers in an oil, as well as various melting, dispersing and cooling methods.

The capsule forming material used in a given imaging system is selected based on the photosensitive composition present in the encapsulate. Thus, the formed capsule wall must be transmissive to the exposure radiation. Of the above systems urea-resorcinol-formaldehyde and gelatin capsules are preferred.

The mean size of the capsules used in the present invention may vary over a broad range but generally ranges from approximately 1 to 25 microns. As a general rule, image resolution improves as the capsule size decreases with the caveat that if the capsule size is too small, the capsule may sit within incongruities in the support and the support may screen the capsules from exposure. Very small capsules may also fail to rupture upon the application of pressure. In view of the foregoing, it has been found that a preferred mean capsule size range is approximately 3 to 15 microns and particularly approximately 3 to 10 microns.

In a preferred embodiment of the invention, the imaging system is a sealed self-contained imaging system. This sealed format is advantageous because it prevents the developer material and the chemicals in the microcapsules from contacting persons during handling and, depending on the nature of the supports, it also may prevent oxygen from permeating into the photohardenable material which may improve film speed and the stability of the image. The term "sealed" as used herein refers to a seal which is designed as a nontemporary seal which results in destruction of the imaging assembly if the seal is broken.

The peripheral edges of the self-contained assembly may be sealed additionally by any of the conventional means used to seal polymeric materials such as polyethylene terephthalate. For example, the edges of the films can be heat sealed together or they can be sealed by any other technique. In one embodiment, the PET is sealed using a heat sealing method such as a heat knife.

In the imaging assembly of the invention, the previously mentioned first support is transparent and the second support may be transparent or opaque. In the latter case, an image is provided against a white background as viewed through the transparent support and in the former case a transparency is provided in which the image is viewed as a transparency preferably using an overhead or slide projector. Sometimes herein the first support may be referred to as the "front" support and the second support may be referred to as the "back" support. Typically, the first transparent support is a polyethylene terephthalate film (PET) and the second support is preferably a polyethylene terephthalate film containing an opacifying agent such as a white pigment. Such supports are known in the art.

In order to ensure that the imaging system is effectively sealed between the supports, a subbing layer is provided between one of the supports and the imaging layer and an adhesive is provided between the other support and the imaging layer. For optical clarity, the subbing layer will typically be located between the first support and the imaging layer. However, which support receives the subbing layer and which support receives the adhesive is a function of which support is coated with the wet imaging layer composition and which is assembled with the coated and dried imaging layer. The support which is coated with the imaging layer composition (which is typically the front support) will be provided with the subbing layer and the support which is assembled will receive the adhesive. In accordance with the preferred embodiment of the invention, the subbing layer is formed from a compound having chemical moieties such as hydroxy groups which will react with and bind to the microcapsules.

The subbing layer must have good compatibility with the imaging layer, not causing image stability problems, and must remain clear and stable. It must allow the image view to be unobstructed; and during exposure the light must not be scattered. It must have good adhesion to the support. Amorphous polyesters have been found to work well as the subbing layer material. This water-dispersible polymer is well suited for this "adhesion, bonding, coating, priming" application. A polymer with molecular weight of 5,000–15,000, with a low hydroxyl number and low acid number, has been found to work well. A specific material of this type is the AQ polymers from Eastman Chemical and, more particularly, AQ38 and AQ55. These polymers include hydroxy groups which are capable of interacting with melamine formaldehyde resin and it is believed that these hydroxy groups bind to the microcapsule walls and thereby provide a very secure bond between the support and the imaging layer. The subbing layer is coated onto the clear PET at a low coat weight, 0.4–2.0 g/m$^2$ with a preferred amount of 0.8–1.2 g/m$^2$.

One technique which is useful to improve media stability resides in conditioning the developer and microcapsule layer at a relative humidity of about 10 to 40% and preferably, about 20%. Most preferably, the layer is conditioned at about 20% R.H., for about 2 to 12 hours or more at ambient temperatures. Sealing of the assembly at low R.H. levels after conditioning assures that the layer is relatively moisture-free during the normal shelf-life of the assembly and this reduces the tendency for the developer layer and the microcapsule layer to remain in contact after development resulting in image darkening as described above.

Adhesive materials useful in the present invention can be selected from the general class of "modified acrylics" which have good adhesion, and which may be formulated with improved "tack" by addition of tackifying resins or other chemical additives. A useful adhesive must be designed for high initial adhesion and for adhesion to plastic substrates like polyester. It must have the ability to flow quickly for laminating to porous material (the imaging layer) and yet have inertness to the imaging layer. High strength adhesives specifically found useful in this invention are the film label stock adhesives of the 3M Company; preferred are 3M's #300 and #310 adhesive formulas which have shown good "inertness" to the imaging layer and its stability, and are useful when applied in the amount of about 0.5 to 2.0 g/m$^2$.

Other examples of adhesives useful in this invention may be aqueous-based adhesives such as Aerosett 2177 or Aerosett 2550 both of which are commercially available from Ashland Chemical Co., PD 0681, AP 6903, and W 3320 available from H. B. Fuller, or solvent-based adhesives such as PS 508 sold by Ashland Chemical Co. The adhesives may be used separately or in combination. Preferably, the adhesive is transparent or translucent and most preferably it is a transparent adhesive which remains clear even after subjecting the assembly to radiation and pressure necessary to image-wise expose and rupture the microcapsules. The amount of the adhesive will vary depending on the nature of the adhesive and the support. The adhesive is generally applied in an amount of about 0.5 to 20 g/m$^2$.

The invention is illustrated in more detail by the following non-limiting examples:

EXAMPLE

Photosensitive materials were prepared using photosensitive microcapsules containing an internal oil phase which, typically, comprises TMPTA/DPHPA monomers, antioxidant, leuco dye, DIDMA, photoinitiator, borate compound, disulfide and isocyanate. As a control, conventional melamine-formaldahyde microcapsules containing a photosensitive internal phase composition were prepared and developed in conjunction with a developer material in a conventional manner. Sample Nos. 1 and 2 were prepared in accordance with the present invention using microcapsules in which the photosensitive internal phase was modified to contain, respectively, two parts and four parts of polyacrylic superabsorbent resin (Nippon Shokubai K. K. AQUALIC CA (ML-10)).

The amounts of ingredients used in the samples (control and trial samples 1 and 2) prepared in this Example are shown in Table 1.

TABLE 1

| Internal Phase | Control Wt.(g) | Sample No. 1 Wt.(g) | Sample No. 2 Wt.(g) |
|---|---|---|---|
| TPMTA | 114.5 | 114.5 | 114.5 |
| DPHPA | 4.1 | 49.1 | 49.1 |
| Tinuvin 292 | 0.41 | 0.41 | 0.41 |
| CA(ML-10) | 0.0 | 2.0 | 4.0 |
| Dye (Yamada) | 17.5 | 17.5 | 17.5 |
| Didma | 1.09 | 1.09 | 1.09 |
| SI 252 (Photoinitiator) | 0.85 | 0.85 | 0.85 |
| Tetrabutylammonium triphenyl borate | 0.69 | 0.69 | 0.69 |
| Altax | 0.55 | 0.55 | 0.55 |
| Isocyanate | 13.09 | 13.09 | 13.09 |

These Cyan internal phases were individually blended with control Magenta and Yellow capsules in the ratio 38:32:30 based on dry weight to make a 100% cyliths blend.

The photosensitive materials were stored under different temperatures and humidity conditions and exposed and developed in a conventional manner. H&D curves were prepared and the photographic properties shown in Table 2 were determined.

TABLE 2

| Run | 1 | 2 | 3 | 4 | Difference | | | |
|---|---|---|---|---|---|---|---|---|
| Tem. (° C.) | 21 | 21 | 21 | 50 | | | | |
| R.H. (%) | 45 | 20 | 80 | 80 | 1 vs. 2 | 1 vs. 3 | 1 vs. 4 | 2 vs. 3 |
| Control | | | | | | | | |
| $D_{max}$ | 1.75 | 1.79 | 1.69 | 1.73 | 0.04 | −0.06 | −0.02 | −0.1 |
| $D_{min}$ | 0.19 | 0.18 | 0.2 | 0.25 | −0.01 | 0.01 | 0.06 | 0.02 |
| $D_{90}$ | 2.71 | 2.69 | 2.66 | 2.88 | −0.02 | −0.05 | 0.17 | −0.03 |
| $D_{50}$ | 3.01 | 3.07 | 2.95 | 3.14 | 0.06 | −0.06 | 0.13 | −0.12 |
| $D_{10}$ | 3.45 | 3.6 | 3.18 | 3.62 | 0.15 | −0.27 | 0.17 | −0.42 |
| Sample No. 1 (Two-Parts Additive) | | | | | | | | |
| $D_{max}$ | 1.71 | 1.8 | 1.76 | 1.74 | 0.09 | 0.05 | 0.03 | −0.04 |
| $D_{min}$ | 0.22 | 0.27 | 0.23 | 0.3 | 0.05 | 0.01 | 0.08 | −0.04 |
| $D_{90}$ | 2.79 | 2.78 | 2.81 | 2.95 | −0.01 | 0.02 | 0.16 | 0.03 |
| $D_{50}$ | 3.09 | 3.12 | 3.07 | 3.2 | 0.03 | −0.02 | 0.11 | −0.05 |
| $D_{10}$ | 3.51 | 3.59 | 3.35 | 3.65 | 0.08 | −0.16 | 0.14 | −0.24 |
| Sample No. 2 (Four-Parts Additive) | | | | | | | | |
| $D_{max}$ | 1.67 | 1.76 | 1.68 | 1.71 | 0.09 | 0.01 | 0.04 | −0.08 |
| $D_{min}$ | 0.22 | 0.23 | 0.23 | 0.3 | 0.01 | 0.01 | 0.08 | 0 |
| $D_{90}$ | 2.79 | 2.81 | 2.82 | 2.91 | 0.02 | 0.03 | 0.12 | 0.01 |
| $D_{50}$ | 3.08 | 3.13 | 3.08 | 3.18 | 0.05 | 0 | 0.1 | −0.05 |
| $D_{10}$ | 3.48 | 3.62 | 3.36 | 3.64 | 0.14 | −0.12 | 0.16 | −0.26 |

Table 2 shows that the addition of a superabsorbent polyacrylic acid copolymer to the internal phase of the microcapsules improves the consistency of the photographic properties of the media regardless of storage conditions. Ideally, the differences in the photographic properties after storage should be minimal. As Table 2 shows, the differences in the photographic properties obtained using the control are substantially reduced by the addition of the polymer to the internal phase.

It has also been observed the addition of the polymer to the internal phase narrows the particle size distribution of the capsules. In particular, approximately 23.4% of the particles in the emulsion from which the microcapsules were prepared using the control composition without the additive were over ten microns, whereas 2.4% were over ten microns when the microcapsules contained two-parts polyacrylic acid and only 1.8% were over ten microns using four-parts polyacrylic acid. This particle size distribution was maintained upon encapsulation of the particles. The particle size distribution of the final capsules obtained using the control included 18% microcapsules greater than 10 microns, whereas only 5.7% of the microcapsules were over ten microns using two-parts of the polymer and only 2.9% were over ten microns using four-parts of the polymer.

Having described the invention in detail and by reference to preferred embodiments thereof, it will be apparent that modifications and variations are possible without departing from the scope of the invention defined in the appended claims.

What is claimed is:

1. A photosensitive material including a support having a layer of photosensitive microcapsules on the surface thereof, said photosensitive microcapsules including an internal phase containing a photosensitive composition and a color precursor wherein, upon image-wise exposing said photosensitive material and rupturing said microcapsules, said color precursor is image-wise released from the microcapsules to form a color image, said photosensitive material further including a superabsorbent polymer or hydrogel in said internal phase.

2. The photosensitive material of claim 1 wherein said material further includes a layer of developer material.

3. The photosensitive material of claim 1 wherein said material comprises a first transparent support and a second support which may be transparent or opaque.

4. The photosensitive material of claim 3 wherein said first transparent support and said second support are sealed along their peripheral edges.

5. The photosensitive material of claim 4 wherein said material further includes a subbing layer between said first transparent support and said layer of photosensitive microcapsules.

6. The photosensitive material of claim 4 wherein said material further includes a layer of an adhesive between said layer of photosensitive microcapsules and said second support.

7. The photosensitive material of claim 1 wherein said superabsorbent polymer or hydrogel is selected from the group consisting of vinyl alcohol polymers or copolymers; acrylic or methacrylic acid polymers or copolymers; alkali metal salts of acrylic or methacrylic acid polymers or copolymers; and alkyl, hydroxyalkyl, or hydroxyalkyl ether esters of acrylic or methacrylic acid polymers or copolymers.

8. The photosensitive material of claim 1 wherein said superabsorbent polymer or hydrogel is present in said internal phase in an amount of about 0.05 to 2.5% by weight of the photosensitive composition.

9. The imaging system of claim 4 wherein said first transparent support is a clear polyethylene terephthalate film and said second support is an opaque polyethylene terephthalate film containing a white pigment.

10. A sealed, self-contained photosensitive material comprising first and second interfacing supports, said first support carrying a coating of photosensitive microcapsules, said microcapsules containing an internal phase which includes a photosensitive composition and a color precursor, and a developer material present on said first support carrying said layer of photosensitive microcapsules or on said second support wherein, upon image-wise exposing said layer of photosensitive microcapsules and rupturing said microcapsules, the color precursor is released from said microcapsules and reacts with said developer material to form a color image, wherein, said material includes a superabsorbent polymer or hydrogel in said internal phase.

11. The self-contained photosensitive material of claim 10 wherein said interfacing support are sealed at their perimeter.

* * * * *